(12) United States Patent
Karras et al.

(10) Patent No.: US 9,876,582 B2
(45) Date of Patent: Jan. 23, 2018

(54) INTEGRATED MULTICHANNEL PHOTONIC RECEIVER

(71) Applicant: Lockheed Martin Corporation, Bethesda, MD (US)

(72) Inventors: Thomas William Karras, Berwyn, PA (US); Stephen Voiers Robertson, Aurora, CO (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 15/238,635

(22) Filed: Aug. 16, 2016

(65) Prior Publication Data

US 2017/0054512 A1   Feb. 23, 2017

Related U.S. Application Data

(60) Provisional application No. 62/206,815, filed on Aug. 18, 2015.

(51) Int. Cl.
| | |
|---|---|
| *H04B 10/00* | (2013.01) |
| *H04B 10/61* | (2013.01) |
| *H04B 10/11* | (2013.01) |
| *H04B 10/2575* | (2013.01) |

(52) U.S. Cl.
CPC .......... *H04B 10/616* (2013.01); *H04B 10/11* (2013.01); *H04B 10/2575* (2013.01)

(58) Field of Classification Search
CPC ... H04B 10/616; H04B 10/2575; H04B 10/11
See application file for complete search history.

(56) References Cited

U.S. PATENT DOCUMENTS

| | | | | |
|---|---|---|---|---|
| 7,218,901 | B1 * | 5/2007 | Mobley | H04L 12/2801 455/182.2 |
| 7,269,354 | B1 * | 9/2007 | Silverman | H04B 10/2575 398/115 |
| 8,023,540 | B2 * | 9/2011 | Kupershmidt | H01S 5/14 359/326 |
| 8,103,168 | B1 * | 1/2012 | Enoch | H04B 1/30 398/140 |
| 9,287,993 | B1 * | 3/2016 | Adleman | H04B 10/2575 |

(Continued)

*Primary Examiner* — Danny Leung
(74) *Attorney, Agent, or Firm* — McDermott Will & Emery LLP

(57) ABSTRACT

An integrated multi-channel photonic radio-frequency (RF) receiver system includes a master oscillator including a laser source configured to generate laser light. A local oscillator (LO) path may include an LO generator, an LO modulator, an optical LO filter, and an optical amplifier optically coupled to one another to generate an LO signal. Multiple RF-modulation channels are coupled through an optical switch to a number of channel filters and configured to produce a number of filtered RF-modulated optical signals. An optical combiner may combine the LO signal with each filtered RF-modulated optical signal to generate down-converted optical signals. Each channel of the plurality of RF-modulation channels includes a channel laser coupled to a channel modulator, and the LO generator and channel lasers of the RF-modulation channels are fed by the laser light of the master oscillator.

20 Claims, 4 Drawing Sheets

(56) References Cited

U.S. PATENT DOCUMENTS

| | | | |
|---|---|---|---|
| 2003/0128980 A1* | 7/2003 | Abeles | H04B 10/2575 398/48 |
| 2008/0038001 A1* | 2/2008 | Becker | H04B 10/616 398/204 |
| 2008/0091350 A1* | 4/2008 | Smith | G01C 21/165 701/472 |
| 2009/0245306 A1* | 10/2009 | Rakuljic | H01S 5/0687 372/29.011 |
| 2009/0296751 A1* | 12/2009 | Kewitsch | H01S 3/2308 372/18 |
| 2010/0021166 A1* | 1/2010 | Way | H04J 14/02 398/79 |
| 2014/0255039 A1* | 9/2014 | Prather | H04B 10/1129 398/130 |
| 2015/0132005 A1* | 5/2015 | Karras | H04B 10/90 398/115 |
| 2017/0054512 A1* | 2/2017 | Karras | H04B 10/616 |

\* cited by examiner

INTEGRATED MULTICHANNEL PHOTONIC RECEIVER

CROSS-REFERENCE TO RELATED APPLICATIONS

This application claims the benefit of priority under 35 U.S.C. §119 from U.S. Provisional Patent Application 62/206,815 filed Aug. 18, 2015, which is incorporated herein by reference in its entirety.

STATEMENT REGARDING FEDERALLY SPONSORED RESEARCH OR DEVELOPMENT

Not applicable

FIELD OF THE INVENTION

The present invention generally relates to optical signal processing, and more particularly, to an integrated multi-channel photonic receiver.

BACKGROUND

Single channel photonic modules are used in a number of applications, for example, in communications and electronic warfare (EW) applications. A single channel photonic module may provide electronic-to-optical conversion, frequency translation in a wide frequency range (e.g., 100 MHz to 100 GHz and beyond), and multi-pole MHz-GHz filtering. Single channel photonic modules may further provide optical fiber remoting, combining, splitting, and switching, and optical-to-electronic conversion in a package that can be smaller (e.g., approximately 10×), lighter, and cheaper than other technologies provide. However, many applications may require multichannel implementations that are similarly compact and meet a number of performance requirements, including optical power, operating frequency, and dynamic range performance requirements.

SUMMARY

According to various aspects of the subject technology, methods and configurations for providing an integrated multichannel receiver are described. The integrated multi-channel receiver of the subject technology spares laser active elements, while using fewer modulators and passive filters. The subject technology uses an injection locking approach in which several individual channel lasers, driven by a single oscillator laser, can drive each channel, all with the same wavelength but different modulators and RF signals. In some aspects, the channel lasers are followed by modulators and channel defining filters, similar to a single channel device.

In some other aspects, an integrated multi-channel photonic radio-frequency (RF) receiver system includes a master oscillator including a laser source configured to generate laser light. A local oscillator (LO) path may include an LO modulator, an optical LO filter, and an optical amplifier optically coupled to one another and driven by an LO signal generator. Multiple RF-modulation channels are coupled through an optical switch to a number of channel filters and configured to produce a number of filtered RF-modulated optical signals. An optical combiner may combine the LO signal with each RF-modulated optical signal to generate down-converted or up-converted optical signals. Each channel of the plurality of RF-modulation channels includes a channel laser coupled to a channel modulator, and the channel lasers of the RF-modulation channels are fed by the laser light of the master oscillator.

In other aspects, a method for providing an integrated multi-channel photonic RF receiver system includes providing a master oscillator to generate laser light. An LO path is provided by optically coupling an LO modulator, an optical LO filter, and an optical amplifier. Multiple RF-modulation channels are provided. Each channel includes a channel laser coupled to a channel modulator. The LO path and the plurality of RF-modulation channels are fed by the laser light generated by the master oscillator. The RF-modulation channels are coupled through an optical switch to a number of channel filters to produce filtered RF-modulated optical signals. Using optical combiners, the LO signal is combined with the respective filtered RF-modulated optical signal to generate down-converted optical signals.

In yet other aspects, a multi-channel photonic RF receiver system for space flight applications includes a laser source chip to generate a carrier laser light and an LO module fed by the carrier laser light and configured to generate an LO signal. A number N of RF-modulation channels are fed by the carrier laser light and are coupled through an N×M optical switch to a number M of channel filters to produce M filtered RF-modulated optical signal. The number M is smaller than N. A combiner performs a heterodyne process by mixing the LO signal with the M filtered RF-modulated optical signals. Each channel of the N RF-modulation channels includes a channel laser coupled to a channel modulator that is configured to modulate an output of the channel laser with an RF channel signal.

The foregoing has outlined rather broadly the features of the present disclosure in order that the detailed description that follows can be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific aspects of the disclosure, wherein.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and can be practiced using one or more implementations. In one or more instances, well-known structures and components are shown in block diagram form in order to avoid obscuring the concepts of the subject technology.

The present disclosure is directed, in part, to methods and configurations for providing an integrated multichannel receiver with strong advantages for space and airborne applications are described. The integrated multichannel receiver of the subject technology can be a single module with several channels, which allows redundancy. For example, there can be a spare for several active channels that can be wavelength locked to a single wavelength using free space coupling or waveguide-based coupling rather than fiber coupling in order to further reduce size, mass, and cost. One specific problem with fiber coupling is that it may not be readily integratable with narrow channel filters used for separating frequencies of a multi-channel receiver. The integrated multichannel receiver disclosed herein includes a number of advantageous features. For example, the subject technology uses fewer laser active elements, while also using fewer modulators and passive filters, and avoids using fiber coupling between receiver modules resulting in appreciable cost saving and reduction in size, and mass, which is of particular importance for space and airborne applications.

Figure 1A:
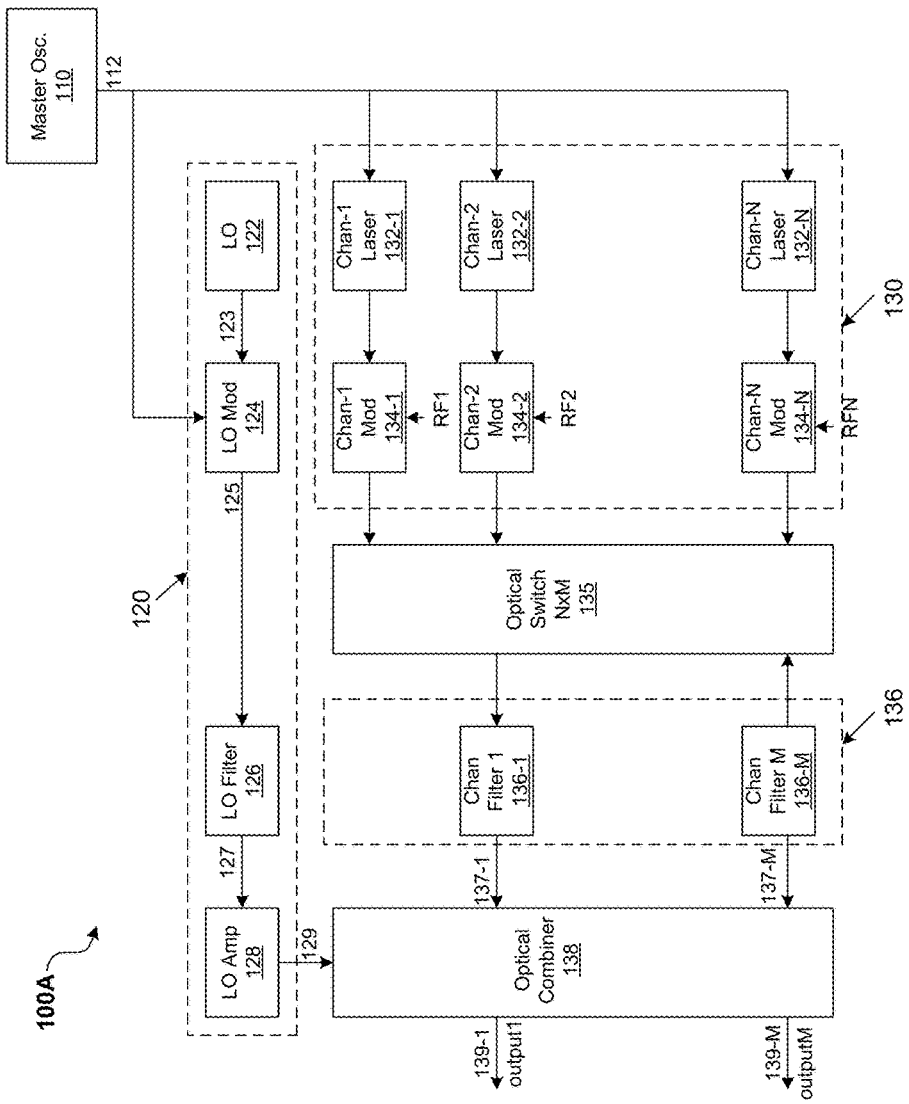
FIG. 1A is a high-level diagram illustrating an example architecture of an integrated multi-channel photonic radio-frequency (RF) receiver system, according to certain aspects of the disclosure.

FIG. 1A is a high-level diagram illustrating an example architecture of an integrated multi-channel photonic radio-frequency (RF) receiver system 100A, according to certain aspects of the disclosure. The multi-channel receiver system 100A includes a master laser oscillator 110, a local oscillator (LO) generation path 120, RF modulation channels 130, an optical switch 135, channel filters 136, and an optical combiner 138. The LO generation path 120 includes an LO generator 122, an LO modulator 124, an LO filter 126, and an optical amplifier 128. The RF modulation channels 130 includes a number N (e.g., 4, 7, or more) of RF modulation channels coupled through the optical switch 135 to the channel filters 136. Each RF modulation channel includes a channel laser 132-1 (e.g., of 132-1 through 132-N) coupled to a channel modulator 134-1 (e.g., of 134-1 through 134-N). Channel filters 136 include a number M of channel filters (e.g., 136-1 through 136-M). In some aspects, the optical switch 135 is controlled by an appropriate optical switching network within the integrated package of the multi-channel receiver.

The multi-channel receiver system 100A allows for RF modulation channel redundancy by providing N RF modulation channels and enabling M of these channels to be selected by the optical switch 135 for operations at a given time. An important feature of the subject disclosure is the use of a single laser oscillator (e.g., master oscillator 110) for providing laser power to other lasers of the receiver and a single LO path (e.g., 120) to be shared with all RF modulation channels 130. For example, the master oscillator 110 can provide laser power to the LO modulator 124, the LO amplifier 128, and each of channel lasers 132.

In some aspects, the master oscillator 110 generates a laser light (e.g., a carrier laser light) at a wavelength of about 1550 nanometers (nm) to be compatible with telecom component characteristics (thus drawing off of that large technology base). The wavelength of the master oscillator 110 may be controllable, so that the master oscillator 110 is compatible with wavelength locking to a filter. The master oscillator 110 may have a line-width sufficiently narrow to be compatible with MHz-class channelization, and/or relative-intensity noise (RIN) that is low enough so as to not dominate the receiver noise. For example, a semiconductor distributed-feedback (DFB) laser that can satisfy the foregoing requirements may be used for the master oscillator 110. Other laser sources with other characteristics can be used if they are sufficiently small.

In one or more aspects, the electrical LO generator 122 is an opto-electronic oscillator that generates an electrical LO signal 123, and which may be derived from the laser light 112 of the master oscillator 110, or from a separate laser light source. The electrical LO signal 123 is used by the LO modulator 124 to modulate the laser light 112 in order to generate an optical LO signal 125 that is filtered by the LO filter 126 and amplified by the LO amplifier 128 to generate the LO signal 129. The LO frequency of LO signal 123 is related to a carrier frequency of the RF signals used by the RF modulation channel 130. For example, if the carrier frequency of the RF signals is within the range of 27-30 GHz, the LO frequency of LO signal 123 can be chosen to be 10 GHz so as to produce a shift with respect to the carrier frequency of the RF signals and enable output signals within the range of 17-20 GHz. The optical LO signal 125 includes three tones, including an upper sideband centered at the frequency of (fSO+fLO) and a lower sideband centered at the frequency of (fSO−fLO), where fSO and fLO are frequencies associated with the master oscillator 110 and the LO, respectively. The function of the LO filter 126 is to separate a desired one of these tones, for example, the lower sideband, as the desired LO signal 127, which after amplification is represented as the LO signal 129. LO amplification may be realized as an injection locked laser (ILL) injected with laser light 127 from the output of the LO filter 126 so as to preserve low noise characteristics in the LO signal 129.

Returning to the RF modulation channels 130, the channel lasers 132 (e.g., 132-1) are injection locked lasers injected with the laser light 112 of the master oscillator 110 and their wavelengths are locked to the operating wavelength (e.g., 1550 nm) of the master oscillator 110. For their relationship with the master oscillator 110, the channel lasers 132 are also referred to as slave lasers. The laser light output of the channel lasers 132 are modulated via the modulators 134 by respective RF signals (e.g., RF1 through RFN). Selected ones of the RF-modulated optical signals (e.g., outputs of the optical switch 135) are sent to the channel filters 136 for filtering.

The RF modulated optical signals include three tones, including an upper sideband centered at the frequency of (fSO+fRF) and a lower sideband centered at the frequency of (fSO−fRF), where fRF is the frequency associated with the respective RF signal (e.g., RF1). The function of the channel filters 136 (e.g., 136-1 through 136-M) is to separate a desired one of these tones, for example, the lower sideband. The desired band of the RF-modulated optical signal 137-1 (e.g., of 137-1 through 137-M) as separated by the channel filters 136 is mixed, by the optical combiner 138, with the LO signal 129 to generate a down-converted or up-converted AARF-modulated signal 139-1 (e.g., of 139-1 through 139-M) at the output 1 of the optical combiner 138.

Figure 1B:
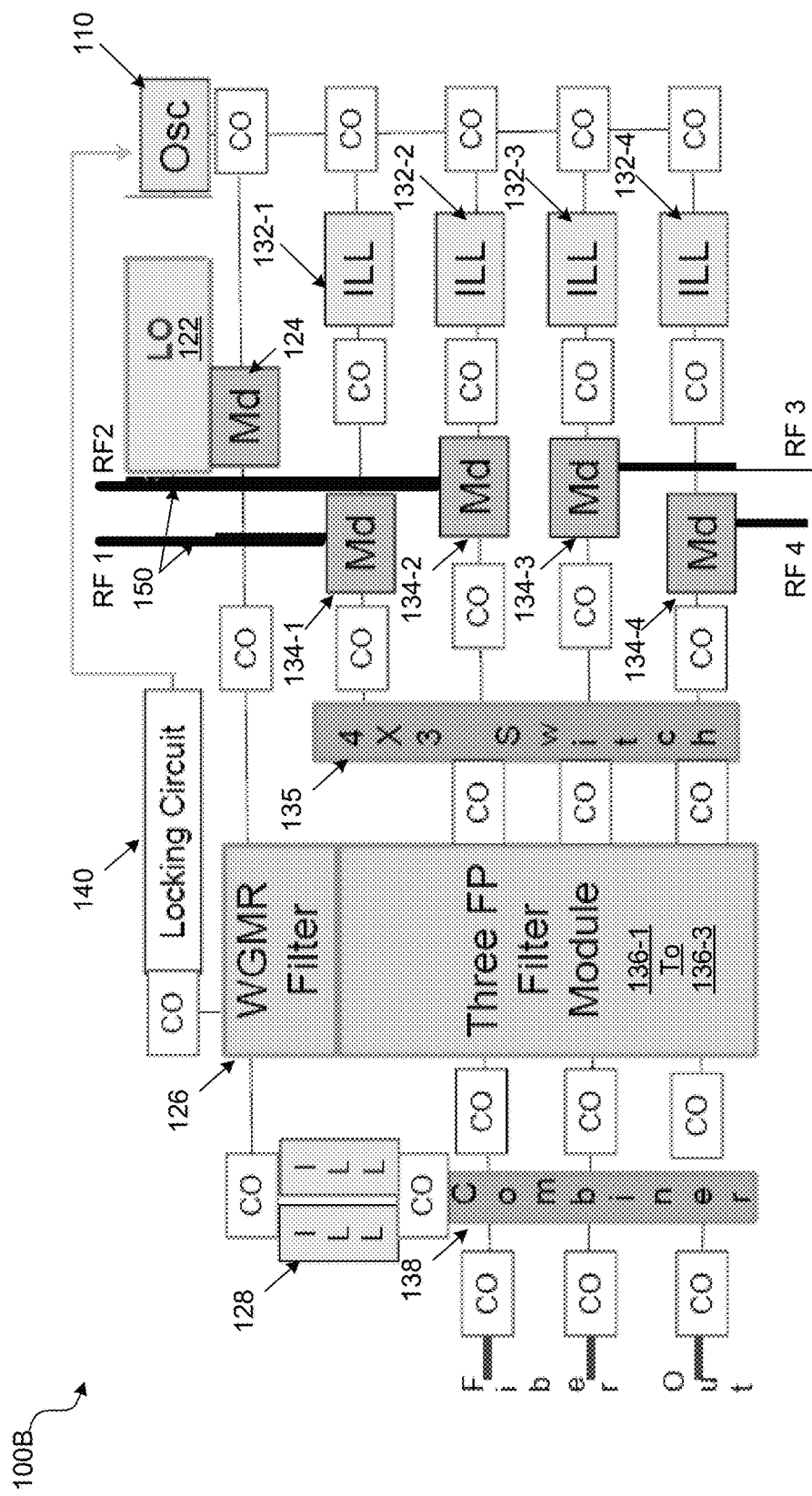
FIG. 1B is a diagram illustrating an example implementation of the receiver system of FIG. 1A, according to certain aspects of the disclosure.

FIG. 1B is a diagram illustrating an example implementation 100B of the receiver system 100A of FIG. 1A, according to certain aspects the disclosure. The structure of receiver as shown in the implementation 100B, is similar to the architecture 100A of FIG. 1A, except for the addition of the locking circuit 140 described herein. The description above of the architecture 100A was based on to the functionality aspects of the multichannel receiver, wherein the multichannel operation with a single laser source (e.g., master oscillator 110) and a single LO generation path (e.g., 120) was explained. The discussion herein is focused on the implementation aspects of the multichannel receiver as an integrated package such as a photonic integrated circuit (IC) or a hybrid photonic IC with a number of chips integrated on a single substrate (e.g., a metallic substrate). Implementation with coupling optics (CO) between substrate elements is shown.

The implementation 100B, includes four RF modulation channels formed by the injection locked channel lasers (ILLs) 132-1 through 132-4 and four modulators (Mds) 134-1 through 134-4. The optical switch 135 is a 4×3 switch that can select three of the four RF modulation channels for coupling to the channel filters 136-1 through 136-3. As seen in FIG. 1B, the LO optical amplifier 128 is implemented, with 2:1 redundancy using two injection locked lasers (ILLs), such that at any given time only one of ILLs 128 is being used. In some aspects, several independent LO paths 120 can be used to allow change in the LO signal mixed with a given RF modulated channel signal.

In one or more implementations, the master oscillator 110 is optically coupled via coupling optics (CO) to the LO modulator (Md) 124 and the channel lasers (ILL) 132. The CO blocks, as shown in various sections of FIG. 1B, can represent non-optical fiber couplings, such as waveguide-based coupling or free-space coupling through independent free standing optical elements. In some aspects, the master oscillator 110 is a millimeter scale semiconductor distributed feedback laser with the operating wavelength of 1550 nm. The master oscillator 110 may be a 500 mw output capable device operated at an output optical power sufficient to lock all slave lasers, such as the LO modulator 124 and the channel lasers 132. In some aspects, each of the channel lasers 132 (e.g., 132-1 to 132-4) is an ILL that can be a 500 mWatt optical output capable device operated at its maximum electrical efficiency point at about 100 mWatt optical output. The four channel lasers 120 may require laser oscillator input of a few (e.g., 5) mWatt and the LO optical amplifier 128 may require laser oscillator input of about ten mWatts to maintain a 30 GHz bandwidth (BW), thus the master laser oscillator 110 would have to produce a total of about 15 mWatt. This level of power is such a low level that allows a significantly long lifetime for the master laser oscillator 110. Therefore, the master oscillator 110 may not require redundancy, as is supplied for the channel lasers 132.

In some aspects, the LO signal generator 122 is a small (e.g., less than 1 cm) opto-electronic oscillator that can be implemented as a separate module or integrated with the multi-channel receiver package. In some implementations, a tunable oscillator can be used as the LO signal generator 122 that allows maximum system agility and compactness. In one or more implementations, the LO modulator 124 and the channel modulators 134 are centimeter scale or smaller waveguide phase modulators, such as smaller than two cm lithium niobate (LiNb) waveguide phase modulators operable at frequencies up to and beyond 100 GHz. The RF channel modulators 134 can receive RF signals RF1 through RF4 (e.g., uplink signals) via electrically conductive connectors 150. The LO generator 122 may be attached to the LO modulator 124 and/or the master oscillator 110.

The channel modulators 134 can modulate the RF signals on the optical carrier (e.g., laser light from the master oscillator 110 and channel lasers ILL 132) with a bandwidth of up to at least 100 GHz, for example, to be compatible with projected data rate requirements. More limited bandwidth capability (e.g., 5-30 GHz) may be adequate for some applications. Optical power handling capacity for the channel modulators 134 may be compatible with that of the master oscillator 110. The channel modulators 134 and the LO modulator 124 are capable of modulating RF signals and LO signals on the optical carrier with a bandwidth required for frequency translation from uplink frequencies (e.g., 20 GHz) to downlink frequencies (e.g., 1 GHz).

Examples of the channel modulators 134 include miniature (e.g., centimeter scale) lithium niobate waveguide phase modulators. The lithium niobate waveguide phase modulator has a number of advantages over electro-absorption amplitude modulator (EAM) and Mach Zehnder Interferometer (MZI) based devices including improved gain and noise figure as described below. A suitable lithium niobate waveguide phase modulator has a low Vpi (e.g., a voltage required to change the phase by 180 degrees) and a low optical loss, can handle high optical power (>1-2 watts), can support high bandwidth (>100 GHz), and can fit into small packages. Other similar types of optical modulators, for example, indium phosphide MZI-based modulators (MZMs) can be used. In some aspects, the channel modulators 134 and/or the LO modulator 124 can be intensity modulators or phase modulators. Performance characteristics of these modulators are discussed below.

The channel filter 136 may include one or more optical RF multi-pole (e.g., 5-9-pole) filters with pass-bands that meet communication system requirements (e.g., 1 MHz to 1 GHz 3-dB channel width, less than 0.5 dB ripple, and 70 dB out-of-band rejection). The band-pass filters (BPFs) may include Fabry-Pérot filters (FP), whispering gallery mode resonator (WGMR) filters, planar ring resonator filters, or fiber Bragg grating filters. In some aspects sharp-edge filter architectures such as Chebyshev and elliptic filters can be used. The filters may also facilitate wavelength locking of the laser source. Filter optical power handling and insertion loss do not limit RF signal recovery at the system output. For example, a filter that can handle an optical power of about 10-100 mWatt with less than about 1 dB of loss in the pass-band can be used. Alternatively, in some aspects, higher losses such as 2 to 7 dB can be acceptable. In some aspects, the LO filter 126 is a monolithic assembly of millimeter scale resonators, such as free standing whispering gallery mode resonator (WGMR).

According to some aspects of the subject technology, centimeter scale filters should satisfy the foregoing requirements and could provide center frequency and channel width tuning. Filters that are based on a monolithic assembly of several very high-Q and WGMR filters may be most suitable for pass-bands of 1-100 MHz. Fabry-Pérot filters, planar ring resonator filters or fiber Bragg grating filters may be most suitable for pass-bands above 100 MHz. The specific filter design, particularly the number of poles used, is dependent upon the pass-band requirements.

In some aspects, the locking circuit 140 is optically coupled via a CO block to the optical LO filter 126 and electrically coupled to the master oscillator 110. The locking circuit 140 can generate an electrical wavelength correction signal, based on a component of an optical output of the optical LO filter 126, to facilitate wavelength stability of the master oscillator 110.

The subject technology is not limited to use of these filters within these example frequency ranges. As various filter technologies mature, these and other filters can be used for various pass-bands.

Figure 2:
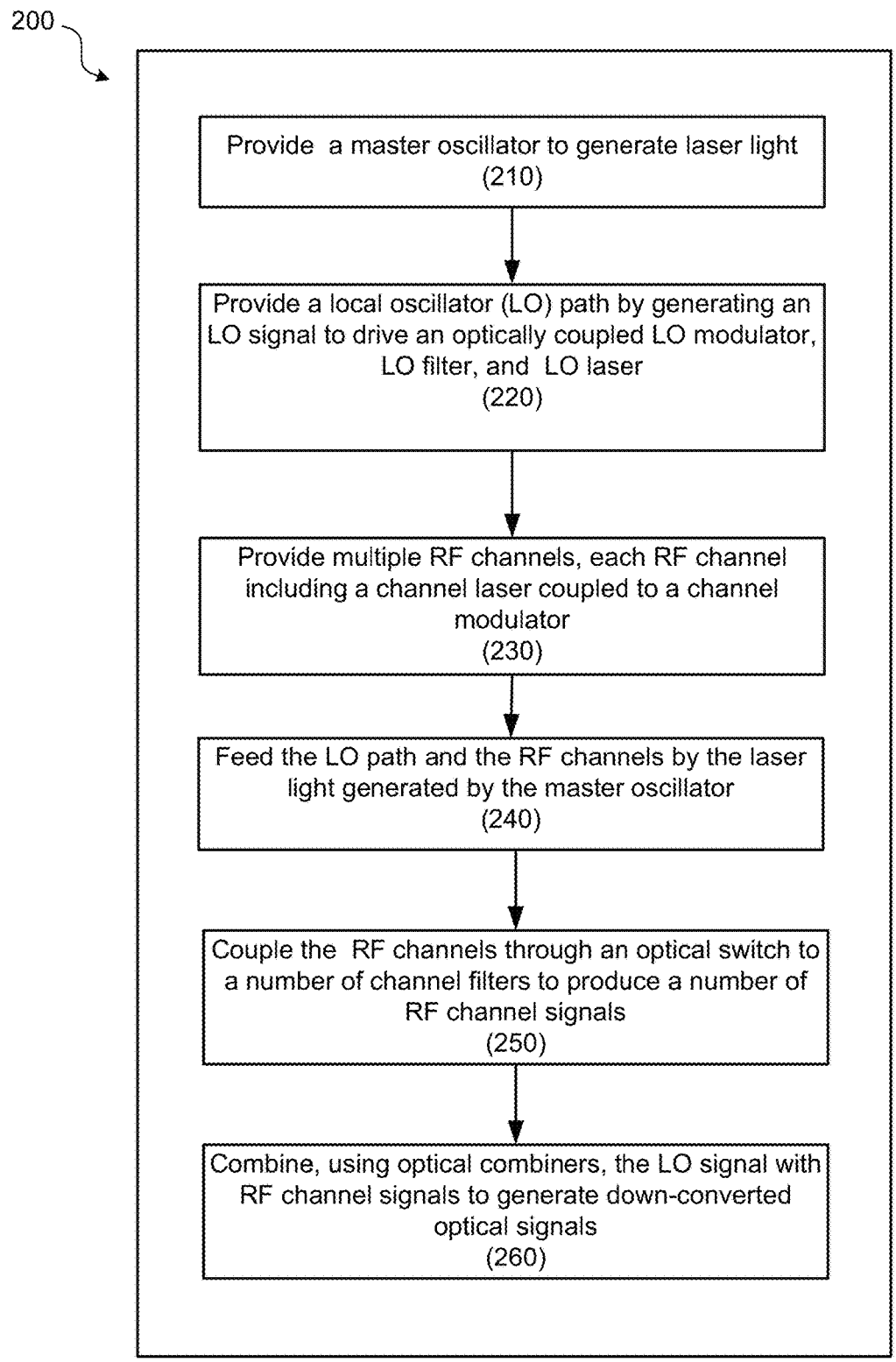
FIG. 2 is a flow diagram illustrating an example of a method for providing an integrated multi-channel photonic RF receiver system, according to certain aspects of the disclosure.

The operating channel lasers 132 may be selected by power switching and routing between the channel lasers 132, and the channel modulators 134 may be selected by the optical switch 135 (e.g., a 4×3 switch), implemented within the integrated package, for routing to the channel filter 136. Appropriate laser sources, modulators, and filters, switch arrays, and free space micro-optically coupled packaging can be used to implement the integrated multichannel receiver with required component redundancy FIG. 2 is a flow diagram illustrating an example of a method 200 for providing an integrated multi-channel photonic RF receiver system (e.g., 100A of FIG. 1A), according to certain aspects the disclosure. The method 200 includes providing a master oscillator (e.g., 110 of FIG. 1A or FIG. 1B) to generate laser light (e.g., 112 of FIG. 1A) (210). An LO path (e.g., 120 of FIG. 1A) is provided to generate an LO signal (e.g., 129 of FIG. 1A) by optically coupling an LO generator (e.g., 122 of FIG. 1A or FIG. 1B), an LO modulator (e.g., 124 of FIG. 1A or FIG. 1B), an optical LO filter (e.g., 126 of FIG. 1A or FIG. 1B), and an optical amplifier (e.g., 128 of FIG. 1A or FIG. 1B) (220). A number of RF-modulation channels (e.g., 130 of FIG. 1A) are provided, where each channel includes a channel laser (e.g., one of 132 of FIG. 1A or FIG. 1B) coupled to a channel modulator (e.g., one of 134 of FIG. 1A or FIG. 1B) (230). The laser light generated by the master oscillator may be used to feed and lock an operating wavelength of lasers of the LO path and RF-modulation channels (240). The RF-modulation channels are coupled through an optical switch (e.g., 135 of FIG. 1A or FIG. 1B) to a number of channel filters (e.g., 136 of FIG. 1A or FIG. 1B) to produce filtered RF-modulated optical signals (e.g., 137 of FIG. 1A) (250). Using an optical combiner (e.g., 138 of FIG. 1A or FIG. 1B), the LO signal are combined with each filtered RF-modulated optical signal to generate down-converted (or up-converted) optical signals (e.g., 139 of FIG. 1A) (260).

Figure 3:
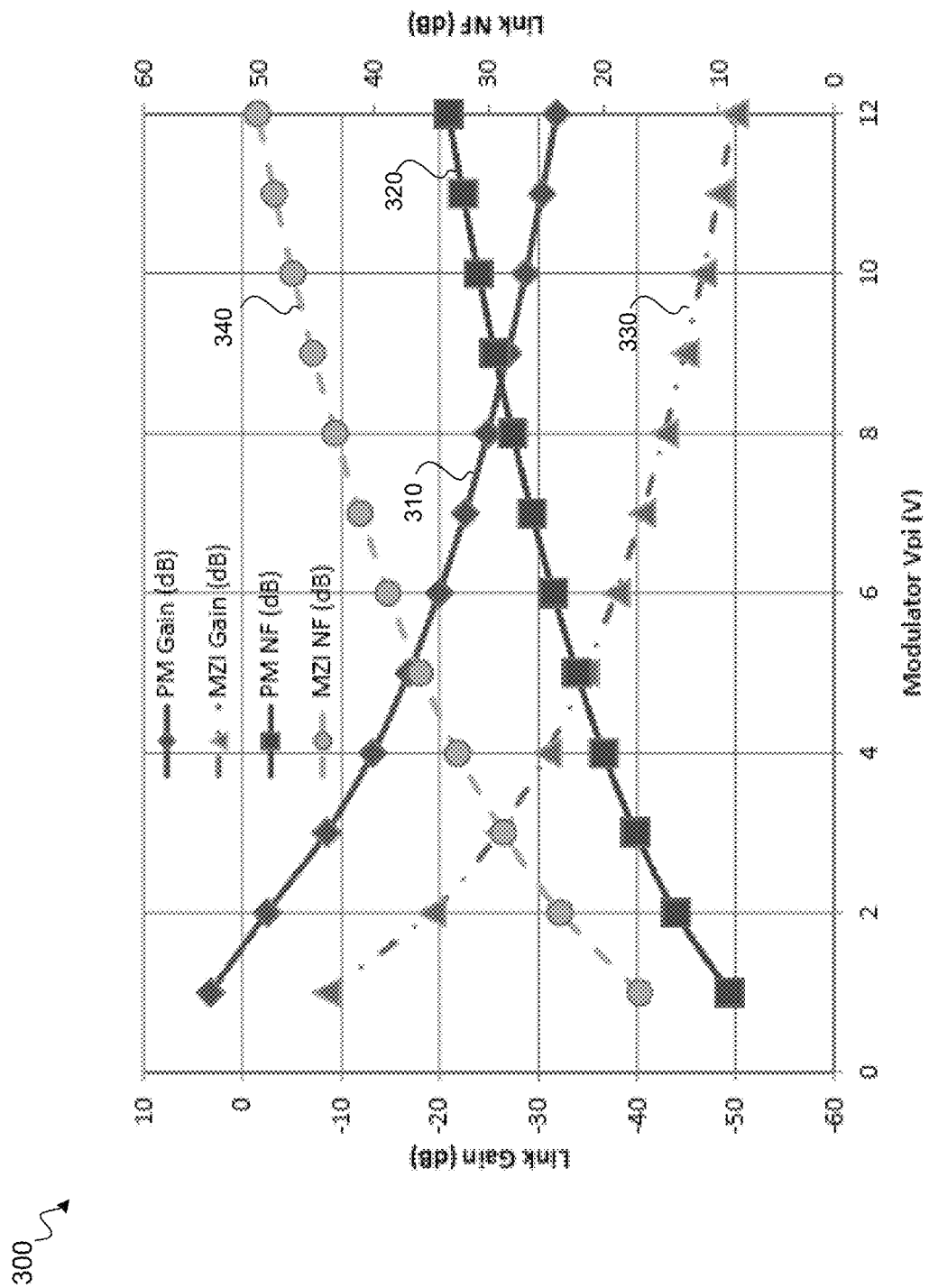
FIG. 3 illustrates example variations of gain and noise figure (NF) versus modulator Vpi for a phase modulator (PM) or an intensity modulator according to certain aspects of the disclosure.

FIG. 3 illustrates example variation of gain and noise figure (NF) plots 300 versus modulator Vpi for a phase modulator (PM) or an intensity modulator according to some aspects of the disclosure. The plots 300 include a plot 310 of gain and a plot 320 of NF corresponding to use of a phase modulator (e.g., a miniature lithium niobate waveguide phase modulator) and a plot 330 of gain and a plot 340 of NF corresponding to use of an intensity modulator (e.g., a miniature lithium niobate MZI modulator). The results show that using the phase modulator can produce higher gain and lower NF values than using an intensity modulator.

In some aspects, the subject technology (e.g., receiver system shown in FIG. 1B) includes hybrid integration of free space micro-optics or gratings with photonic components. This hybrid integration permits relatively lower cost and more rapid modification and customization of a photonic RF front-end receiver for particular applications as compared to fabricating new chips that fully integrate the optical and electronic components (e.g., heterogeneous integration). When large quantities of fully integrated elements are needed, however, a heterogeneous integration approach might be a more suitable approach.

The description of the subject technology is provided to enable any person skilled in the art to practice the various aspects described herein. While the subject technology has been particularly described with reference to the various figures and aspects, it should be understood that these are for illustration purposes only and should not be taken as limiting the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various aspects described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the invention has been described with reference to the disclosed aspects, one having ordinary skill in the art will readily appreciate that these aspects are only illustrative of the invention. It should be understood that various modifications can be made without departing from the spirit of the invention. The particular aspects disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative aspects disclosed above may be altered, combined, or modified and all such variations are considered within the scope and spirit of the present invention. While compositions and methods are described in terms of "comprising," "containing," or "including" various components or steps, the compositions and methods can also "consist essentially of" or "consist of" the various components and operations. All numbers and ranges disclosed above can vary by some amount. Whenever a numerical range with a lower limit and an upper limit is disclosed, any number and any subrange falling within the broader range are specifically disclosed. Also, the terms in the claims have their plain, ordinary meaning unless otherwise explicitly and clearly defined by the patentee. If there is any conflict in the usages of a word or term in this specification and one or more patent or other documents that may be incorporated herein by reference, the definitions that are consistent with this specification should be adopted.

What is claimed is:

1. An integrated multi-channel photonic radio-frequency (RF) receiver system, the system comprising:
   a master oscillator comprising a laser source configured to generate laser light;
   a local oscillator (LO) path comprising an LO generator, an LO modulator, an optical LO filter, and an optical amplifier optically coupled and configured to generate an LO signal;
   a plurality of RF-modulation channels coupled through an optical switch to a plurality of channel filters and configured to produce a plurality of filtered RF-modulated optical signals; and
   an optical combiner configured to combine the LO signal with each filtered RF-modulated optical signal of the plurality of filtered RF-modulated optical signals to generate up- or down-converted optical signals,
   wherein:
   each channel of the plurality of RF-modulation channels includes a channel laser coupled to a channel modulator, and the LO path and channel lasers of the plurality of RF-modulation channels are fed by and wavelength locked to an operating wavelength of the laser light of the master oscillator.

2. The system of claim 1, wherein the plurality of RF-modulation channels comprise N RF-modulation channels and the optical switch comprises an N×M optical switch configured to selectively couple M channels of the N RF-modulation channels to M channel filters.

3. The system of claim 1, wherein the LO generator comprises an opto-electronic oscillator configured to generate an electrical LO signal based on the laser light of the master oscillator or of another laser light source.

4. The system of claim 1, wherein the master oscillator comprises a millimeter scale semiconductor distributed feedback laser with the operating wavelength of 1550 nanometers (nm).

5. The system of claim 4, wherein the channel laser comprises an injection-locked laser locked to the operating wavelength of the master oscillator.

6. The system of claim 1, wherein the LO modulator and the channel modulator comprise centimeter scale or smaller waveguide phase modulators, wherein the centimeter scale or smaller waveguide phase modulators comprise smaller than two cm lithium niobate waveguide phase modulators operable at frequencies up to and beyond 100 GHz.

7. The system of claim 1, wherein the channel modulator is configured to modulate an output light of the channel laser with an RF channel signal to generate an RF-modulated optical signal.

8. The system of claim 1, wherein the optical LO filter comprises a monolithic assembly of millimeter scale free standing whispering gallery mode resonators configured to separate a desired spectral band of an LO-modulated optical signal of the LO modulator.

9. The system of claim 1, wherein each of the plurality of channel filters comprises a Fabry-Pérot filter, a whispering gallery mode resonator filter, a planar ring resonator filter, or a fiber Bragg grating filter configured to separate a desired spectral band of an RF-modulated optical signal of a respective channel modulator.

10. The system of claim 8, further comprising a locking circuit configured to generate an electrical wavelength correction signal, based on a component of an optical output of the optical LO filter, to facilitate wavelength stability of the master oscillator.

11. The system of claim 8, wherein the optical amplifier comprises an injection-locked laser and is optically coupled to the optical combiner.

12. The system of claim 1, wherein optical couplings between optical components of the system are achieved via free-space coupling or waveguide-based coupling, and wherein the system is entirely integrated as a single photonic integrated circuit or a hybrid photonic integrated circuit.

13. A method for providing an integrated multi-channel photonic radio-frequency (RF) receiver system, the method comprising:
  providing a master oscillator to generate laser light;
  providing a local oscillator (LO) path to generate an LO signal by optically coupling an LO modulator driven by an LO generator, an optical LO filter, and an optical amplifier;
  providing a plurality of RF-modulation channels, each channel of the plurality of RF-modulation channels including a channel laser coupled to a channel modulator;
  using the laser light generated by the master oscillator to feed and lock an operating wavelength of lasers of the LO path and the plurality of RF-modulation channels;
  coupling the plurality of RF-modulation channels through an optical switch to a plurality of channel filters to produce a plurality of filtered RF-modulated optical signals; and
  combining, using optical combiners, the LO signal with each filtered RF-modulated optical signal of the plurality of filtered RF-modulated optical signals to generate up- or down-converted optical signals.

14. The method of claim 13, wherein the plurality of RF-modulation channels comprise N RF-modulation channels and the optical switch comprises an N×M optical switch, and wherein coupling the plurality of RF-modulation channels through the optical switch to the plurality of channel filters comprises configuring the optical switch to selectively couple M channels of the N RF-modulation channels to M channel filters.

15. The method of claim 13, wherein the LO generator comprises an opto-electronic oscillator, and wherein the method comprises configuring the LO generator to generate an electrical LO signal based on the laser light of the master oscillator or another laser light source.

16. The method of claim 13, wherein the master oscillator comprises a millimeter scale semiconductor distributed feedback laser, and wherein generating the laser light comprises generating a laser light with a wavelength of 1550 nanometers (nm).

17. The method of claim 13, wherein the channel laser comprises an injection-locked laser locked to an operating wavelength of the master oscillator.

18. The method of claim 13, wherein the LO modulator and the channel modulator comprise smaller than two cm lithium niobate waveguide phase modulators operable at frequencies up to and beyond 100 GHz, and the method further comprises configuring the channel modulator to modulate output light of the channel laser with an RF channel signal to generate an RF-modulated optical signal.

19. The method of claim 13, further comprising configuring a locking circuit to generate based on a component of an optical output of the optical LO filter, an electrical wavelength correction signal to facilitate wavelength stability of the master oscillator.

20. A multi-channel photonic radio frequency (RF) receiver system for space flight applications, the system comprising:
  a laser source chip configured to generate a carrier laser light;
  a local oscillator (LO) module fed by the carrier laser light and configured to generate an LO signal;
  a number N of RF-modulation channels fed by the carrier laser light and coupled through an N×M optical switch to a number M of channel filters and configured to produce M filtered RF-modulated optical signal, wherein M is smaller than N; and
  a combiner configured to perform a heterodyne process by mixing the LO signal with the M filtered RF-modulated optical signals,
  wherein each channel of the N RF-modulation channels includes a channel laser coupled to a channel modulator that is configured to modulate an output of the channel laser with an RF channel signal.

* * * * *